US009985101B2

(12) United States Patent
Hatem et al.

(10) Patent No.: US 9,985,101 B2
(45) Date of Patent: May 29, 2018

(54) ENCAPSULATED NANOSTRUCTURES AND METHOD FOR FABRICATING

(71) Applicants: University of Florida Research Foundation, Inc., Gainesville, FL (US); Varian Semiconductor Equipment Associates, Inc., Gloucester, MA (US)

(72) Inventors: Christopher Hatem, North Billerica, MA (US); Kevin S. Jones, Archer, FL (US); William M. Brewer, Gainesville, FL (US)

(73) Assignees: Varian Semiconductor Equipment Associates, Inc., Gloucester, MA (US); University of Florida Research Foundation, Inc., Gainesville, FL (US)

( * ) Notice: Subject to any disclaimer, the term of this patent is extended or adjusted under 35 U.S.C. 154(b) by 0 days. days.

(21) Appl. No.: 15/335,605

(22) Filed: Oct. 27, 2016

(65) Prior Publication Data

US 2017/0125526 A1    May 4, 2017

Related U.S. Application Data

(60) Provisional application No. 62/248,561, filed on Oct. 30, 2015.

(51) Int. Cl.
*H01L 21/00* (2006.01)
*H01L 29/00* (2006.01)
(Continued)

(52) U.S. Cl.
CPC ...... *H01L 29/155* (2013.01); *H01L 21/02236* (2013.01); *H01L 21/02532* (2013.01);
(Continued)

(58) Field of Classification Search
CPC ......... H01L 21/02603; H01L 21/02532; H01L 21/324; H01L 21/02236; H01L 29/155;
(Continued)

(56) References Cited

U.S. PATENT DOCUMENTS 7,829,139 B2    11/2010    Reeves et al.
7,851,790 B2 *  12/2010    Rachmady ............. B82Y 10/00
                                                        257/250
(Continued)

FOREIGN PATENT DOCUMENTS

WO        2015114482 A1    8/2015

OTHER PUBLICATIONS

Tang et al., "A simple route to annihilate defects in silicon nanowire", 2000, Chemical Physics Letters, vol. 328, pp. 346-349 (Oct. 6, 2000).*

(Continued)

*Primary Examiner* — Nikolay Yushin
(74) *Attorney, Agent, or Firm* — Thomas | Horstemeyer, LLP

(57) ABSTRACT

Various nanostructures, including silicon nanowires and encapsulated silicon nanoislands, and methods of making the nanostructures are provided. The methods can include providing a fin structure extending above a substrate, wherein the fin structure has at least one silicon layer and at least two silicon:germanium alloy (SiGe) layers that define sidewalls of the fin structure; and annealing the fin structure in oxygen to form a silicon nanowire assembly. The silicon nanowire assembly can include a silicon nanowire, a SiGe matrix surrounding the silicon nanowire; and a silicon oxide layer disposed on the SiGe matrix. The annealing can be, for example, at a temperature between 800° C. and 1000° C. for five minutes to sixty minutes. The silicon nanowire can have a long axis extending along the fin axis, with perpendicular (Continued)

first and second dimensions extending less than 50 nm along directions perpendicular to the fin axis.

20 Claims, 6 Drawing Sheets

(51) Int. Cl.
| | |
|---|---|
| H01L 29/15 | (2006.01) |
| H01L 21/02 | (2006.01) |
| H01L 21/324 | (2006.01) |
| H01L 29/06 | (2006.01) |
| H01L 29/423 | (2006.01) |
| H01L 29/66 | (2006.01) |
| H01L 29/786 | (2006.01) |
| B82Y 10/00 | (2011.01) |

(52) U.S. Cl.
CPC ...... *H01L 21/02603* (2013.01); *H01L 21/324* (2013.01); *H01L 29/0673* (2013.01); *H01L 29/42392* (2013.01); *H01L 29/66439* (2013.01); *H01L 29/66772* (2013.01); *H01L 29/78654* (2013.01); *H01L 29/78696* (2013.01); *B82Y 10/00* (2013.01)

(58) Field of Classification Search
CPC ......... H01L 29/78696; H01L 29/66772; H01L 29/0673; H01L 29/42392; H01L 29/78654; B82Y 10/00; B82Y 40/00
See application file for complete search history.

(56) References Cited

U.S. PATENT DOCUMENTS

| | | | | |
|---|---|---|---|---|
| 8,088,674 | B2* | 1/2012 | Ernst | B82Y 10/00 |
| | | | | 438/479 |
| 8,878,259 | B2 | 11/2014 | Hovel et al. | |
| 8,927,968 | B2* | 1/2015 | Cohen | H01L 29/66484 |
| | | | | 257/29 |
| 9,035,383 | B2* | 5/2015 | Bangsaruntip | H01L 21/77 |
| | | | | 257/347 |
| 9,129,829 | B2 | 9/2015 | Kuhn et al. | |
| 9,431,483 | B1* | 8/2016 | Wen | H01L 29/0673 |
| 2004/0198064 | A1 | 10/2004 | Subramanian et al. | |
| 2010/0164102 | A1* | 7/2010 | Rachmady | B82Y 10/00 |
| | | | | 257/741 |
| 2010/0273317 | A1* | 10/2010 | Ernst | B82Y 10/00 |
| | | | | 438/479 |
| 2014/0166983 | A1* | 6/2014 | Cohen | H01L 29/66484 |
| | | | | 257/29 |
| 2014/0209864 | A1* | 7/2014 | Bangsaruntip | H01L 21/77 |
| | | | | 257/29 |
| 2015/0053912 | A1 | 2/2015 | Ching et al. | |
| 2015/0053928 | A1 | 2/2015 | Ching et al. | |
| 2015/0099349 | A1 | 4/2015 | Jin et al. | |
| 2015/0104918 | A1 | 4/2015 | Liu et al. | |
| 2015/0287614 | A1 | 10/2015 | Cheng et al. | |

OTHER PUBLICATIONS

International Search Report for PCT/US2016/059037 of Feb. 15, 2017.

Wang, et al., Fabrication of Vertically Stacked Single-Crystalline Si Nanowires Using Self-Limiting Oxidation, Nanotechnology 23 (2012), 1-5.

Clarke, Silicon Nanowire Remains Favorite to Replace FinFET, Semiconductors and Components, IHS Electronics360, Jun. 16, 2015. Available: http://electronics360.globalspec.com/article/5410/silicon-nanowire-remains-favorite-to-replace-finfet. Accessed Mar. 27, 2017.

Myslewski, Silicon Nanowire: The Next Big Thing in Chip Design, The Register, Hardware, Mar. 16, 2012. Available: http://www.theregister.co.uk/2012/03/16/silicon_nanowires/. Accessed Mar. 27, 2017.

* cited by examiner

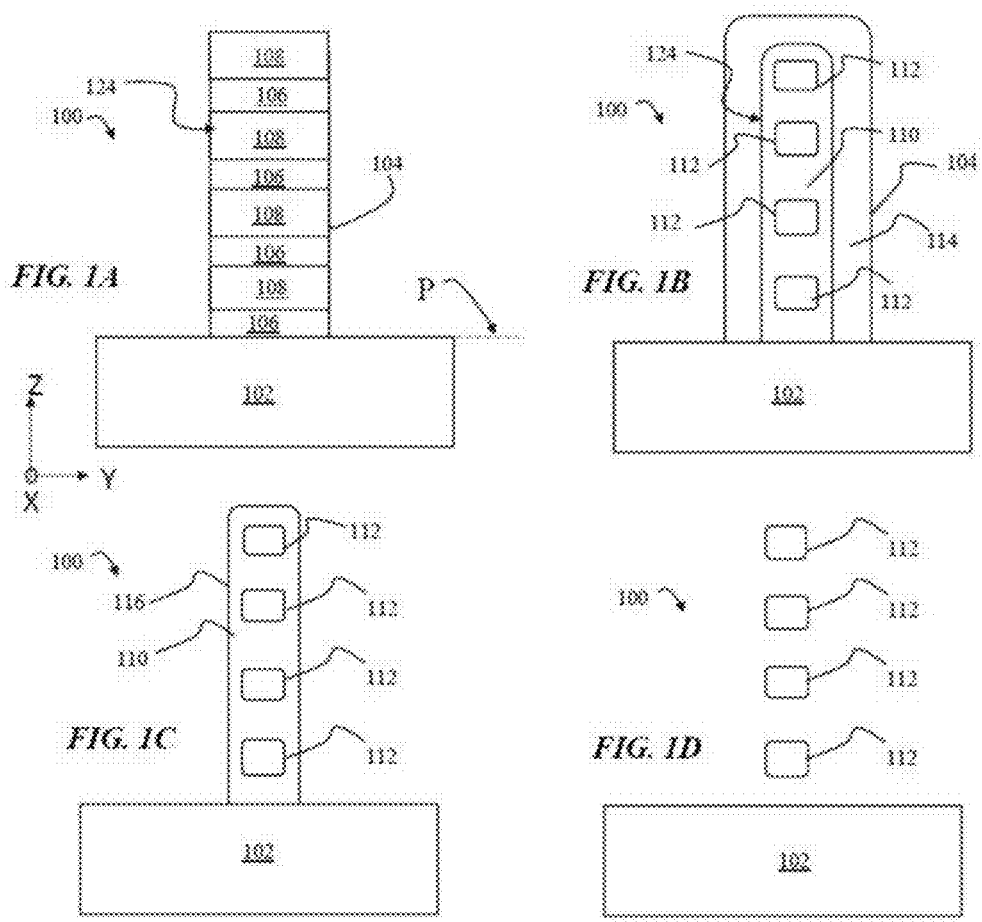

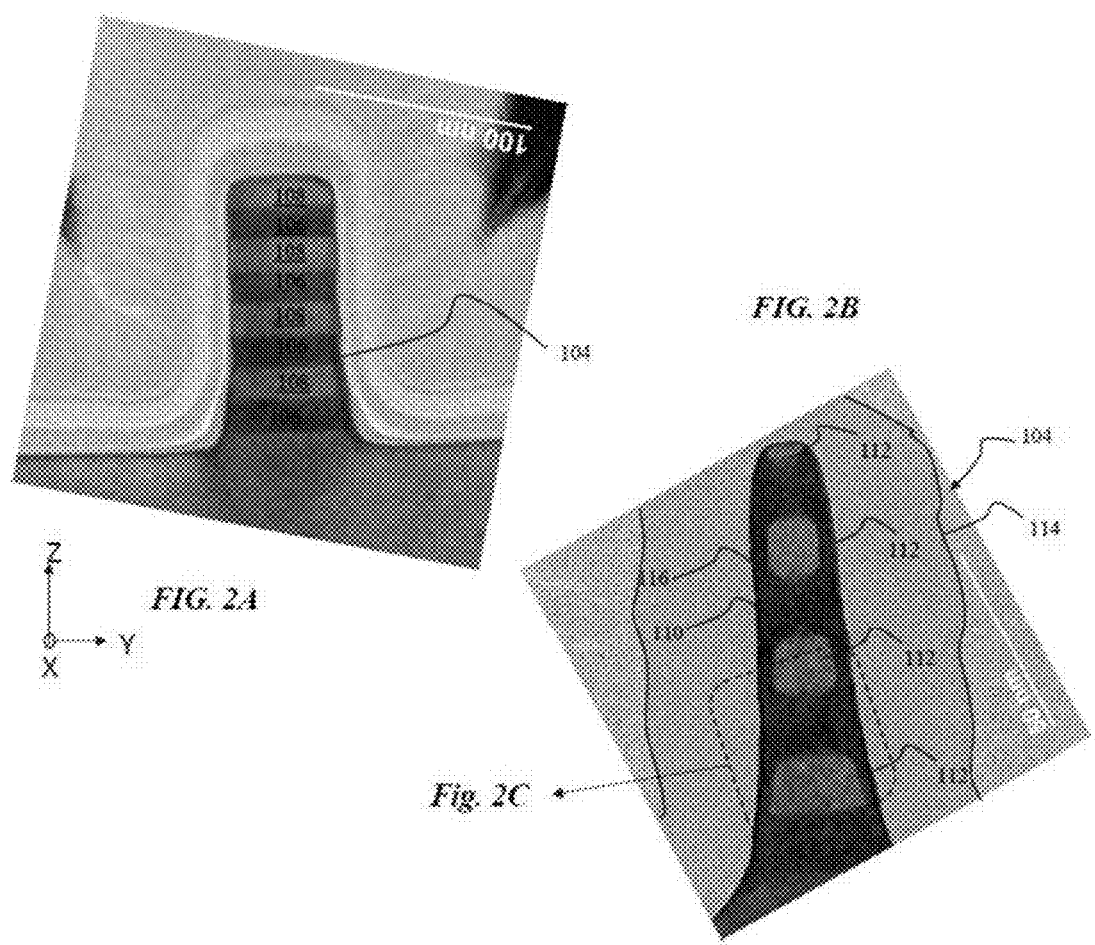

PROVIDING A FIN STRUCTURE EXTENDING ABOVE A SUBSTRATE PLANE OF A SUBSTRATE, WHEREIN THE FIN STRUCTURE COMPRISES AT LEAST THREE LAYERS, WHEREIN THE FIN STRUCTURE COMPRISES AT LEAST ONE SILICON LAYER AND AT LEAST TWO SiGe LAYERS, WHEREIN THE AT LEAST ONE SILICON LAYER AND THE AT LEAST TWO SiGe LAYERS DEFINE SIDEWALLS OF THE FIN STRUCTURE
302

ANNEALING THE FIN STRUCTURE IN AN OXYGEN AMBIENT, WHEREIN A SILICON NANOWIRE ASSEMBLY IS FORMED, WHEREIN THE SILICON NANOWIRE ASSEMBLY COMPRISES: A SILICON NANOWIRE FORMED FROM THE AT LEAST ONE SILICON LAYER, A SiGe MATRIX SURROUNDING THE SILICON NANOWIRE; AND A SILICON OXIDE LAYER DISPOSED ON THE SiGe MATRIX.
304

REMOVING THE OXIDE LAYER
306

SELECTIVELY REMOVING THE SiGe MATRIX, WHEREIN AT LEAST ONE FREE STANDING SILICON NANOWIRE HAVING AN EXPOSED OUTER SURFACE IS FORMED REMOVING THE OXIDE LAYER
308

ENCAPSULATED NANOSTRUCTURES AND METHOD FOR FABRICATING

CROSS-REFERENCE TO RELATED APPLICATIONS

This application claims priority to, and the benefit of, U.S. provisional application entitled "ENCAPSULATED NANOSTRUCTURE AND METHOD FOR FABRICATING" having Ser. No. 62/248,561, filed Oct. 30, 2015, the contents of which are incorporated by reference in their entirety.

TECHNICAL FIELD

The present embodiments relate to device structures, and more particularly, to semiconductor device structures, such as nanowire structures and related fabrication methods.

BACKGROUND

In the present day, three dimensional transistor (3D) devices are used to provide increased performance over planar transistors. Devices such as finFET devices and horizontal-Gate-All-Around (HGAA) FETs are formed from fin-shaped semiconductor regions extending perpendicularly from a substrate plane, such as the plane of a silicon wafer. A narrow structure made of silicon or other semiconductor material may be formed within an HGAA FET or similar device structure, where the narrow structure is elongated in a first direction that defines the direction of current flow in the device structure. The narrow structure may have a cross section in the narrow direction(s) whose dimensions are on the order of 50 nm or less, in some examples, less than 10 nm. Such structures may be integrated within a gate of the device to be formed so as to define a channel. In the case of silicon, such narrow structures may be referred to as silicon nanowires. Such nanowires may be horizontal or parallel to the surface or vertical or orthogonal to the surface of the wafer.

In some approaches of HGAA devices ("the term "HGAA device" is used interchangeably with "HGAA FET device"), the silicon nanowires are formed by fabricating a multilayer structure comprising alternating layers of silicon and silicon:germanium alloy (SiGe) within a fin structure. The overall geometry of the HGAA device after fin formation may resemble a conventional finFET formed of just silicon. Layers of SiGe adjacent a given silicon layer within the fin structure may be selectively removed in an exposed region of the fin structure, allowing the silicon layer within the former fin structure to be exposed on all sides, thus forming a free standing portion of a nanowire in a channel region of the device to be formed. This facilitates formation of gate material on all sides of the exposed free standing nanowire.

While HGAA FET structures afford the ability to electrically gate a silicon nanowire on all sides, the formation of HGAA devices according to known approaches is complicated. Device fabrication may be limited by masking and etch processes, where the width a fin cannot be well controlled below 10 nm. Additionally using known approaches, a superlattice made of silicon and SiGe may have an upper limit in germanium concentration in the SiGe layer of 30% due to lattice mismatch and defect generation when germanium concentration increases. Additionally, the known approaches for HGAA formation using Si/SiGe superlattices has limited ability to strain the resultant silicon nanowire coaxially.

There remains a need for nanostructures and methods of making nanostructures that overcome the aforementioned deficiencies.

SUMMARY

In various embodiments, nanostructures and methods of making nanostructures are provided that overcome one or more of the aforementioned deficiencies. The methods can include methods of forming nanowires and methods of forming encapsulated nanostructures. In various embodiments nanostructures are provided capable of being prepared by one or more methods described herein. The nanostructures can include nanowires and/or encapsulated nanostructures.

In various embodiments, methods of forming a nanowire are provided. The methods can include providing a fin structure extending above a substrate plane of a substrate, wherein the fin structure has at least three layers. The three layers can include, for example, at least one silicon layer and at least two silicon:germanium alloy (SiGe) layers. The layers can define sidewalls of the fin structure. The methods can include annealing the fin structure in an oxidizing ambient, such as oxygen. In various aspects, a silicon nanowire assembly can be formed, wherein the silicon nanowire assembly includes a silicon nanowire formed from the at least one silicon layer, a SiGe matrix surrounding the silicon nanowire; and a silicon oxide layer disposed on the SiGe matrix. In some aspects, the fin structure has at least three SiGe layers and at least two silicon layers, and the silicon nanowire assembly that is formed has at least two silicon nanowires.

In some embodiments, the fin structure has a fin axis extending parallel to a plane of the substrate, wherein the fin structure has a fin width of 60 nm or less, and the silicon nanowire has a first dimension extending less than 50 nm along a first direction perpendicular to the fin axis, and a second dimension extending less than 50 nm along a second direction perpendicular to the first direction and the fin axis.

Various aspects of the methods of forming a nanowire can include annealing the fin structure in an oxygen ambient at a temperature between 800° C. and 1000° C. The annealing of the fin structure can be, for example, for five minutes to sixty minutes. In various aspects, the annealing can lead to increasing concentration of the germanium in the SiGe matrix. For example, in some embodiments, the three layers can include at least two silicon:germanium alloy (SiGe) layers, wherein the at least two SiGe layers have a first germanium concentration of 30% or less, and upon annealing the silicon nanowire assembly can include a SiGe matrix having a second germanium concentration of greater than 30%. In some aspects, the second germanium concentration is greater than 50%.

The silicon nanowire assembly can include a silicon oxide layer disposed on the SiGe matrix. In some embodiments, the methods include removing the silicon oxide layer and selectively removing the SiGe matrix, wherein at least one free standing silicon nanowire having an exposed outer surface is formed. The at least one free standing silicon nanowire can be connected to a source/drain region formed on the substrate. In some embodiments, the method can further include forming a gate around the exposed outer surface, wherein the gate encapsulates the at least one free standing silicon nanowire. In some embodiments, the at least one free standing silicon nanowire can be defect-free.

In various embodiments, nanostructures are provided. The nanostructures can include a substrate; a fin structure disposed on the substrate, the fin structure having a fin axis. The fin structure can include at least one silicon nanowire having a long axis extending along the fin axis, the nanowire including a monocrystalline silicon; and a matrix material surrounding the nanowire, the matrix material including a monocrystalline silicon:germanium alloy (SiGe). In various aspects, the at least one silicon nanowire has a first dimension extending less than 50 nm along a first direction perpendicular to the fin axis, and a second dimension extending less than 50 nm along a second direction perpendicular to the first direction and the fin axis. The fin structure can have an outer surface including a SiGe material. In various aspects, the at least one silicon nanowire does not extend on the outer surface of the fin structure. In some aspects, the at least one silicon nanowire can be defect-free.

In some aspects, the at least one silicon nanowire and SiGe material have a unitary monocrystalline structure. The SiGe material can include a germanium concentration of greater than 50%. In some aspects, the at least one silicon nanowire is a strained silicon nanowire. The nanostructure can include a plurality of silicon nanowires, wherein the matrix material can surround the plurality of silicon nanowires.

In some embodiments, the fin axis extends parallel to a plane of the substrate, wherein the at least one silicon nanowire has a first dimension extending less than 20 nm along a first direction perpendicular to the fin axis, and a second dimension extending less than 20 nm along a second direction perpendicular to the first direction and the fin axis.

Methods of forming an encapsulated nanostructure and encapsulated nanostructures are also provided. The methods can include forming a multilayer structure extending above a substrate plane of a substrate, wherein the multilayer structure has at least three layers, wherein the multilayer structure has at least one silicon layer and at least two silicon:germanium alloy (SiGe) layers, wherein the at least one silicon layer and the at least two SiGe layers define a plurality of sides of the multilayer structure. The methods can further include annealing the multilayer structure in an oxygen ambient, wherein a silicon nanoisland assembly is formed.

Silicon nanoisland assemblies are provided. The silicon nanoisland assembly can have an outer surface having a top surface and a plurality of sides, a silicon nanoisland formed from the at least one silicon layer and disposed in an interior of the silicon nanoisland assembly; a SiGe matrix surrounding the silicon nanoisland; and a silicon oxide layer disposed on the SiGe matrix wherein the outer surface includes silicon oxide.

The annealing step can lead to an increasing germanium concentration in the SiGe matrix. For example, in some embodiments the at least two SiGe layers have a first germanium concentration, and the SiGe matrix has a second germanium concentration greater than the first germanium concentration.

Other systems, methods, features, and advantages of the nanostructures and methods of making nanostructures will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Further aspects of the present disclosure will be readily appreciated upon review of the detailed description of its various embodiments, described below, when taken in conjunction with the accompanying drawings.

FIGS. 1A-1D illustrate an end view of a device structure during different stages of fabrication according to embodiments of the disclosure.

FIG. 2A is an electron micrograph of an end view of a device structure during a first stage of processing.

FIG. 2B is an electron micrograph of an end view of the device structure of FIG. 2A at a subsequent stage of processing subsequent to the stage of FIG. 1A, in accordance with an embodiment of the disclosure.

FIG. 3 presents an exemplary process flow according to embodiments of the disclosure.

DETAILED DESCRIPTION

Figure 1E:
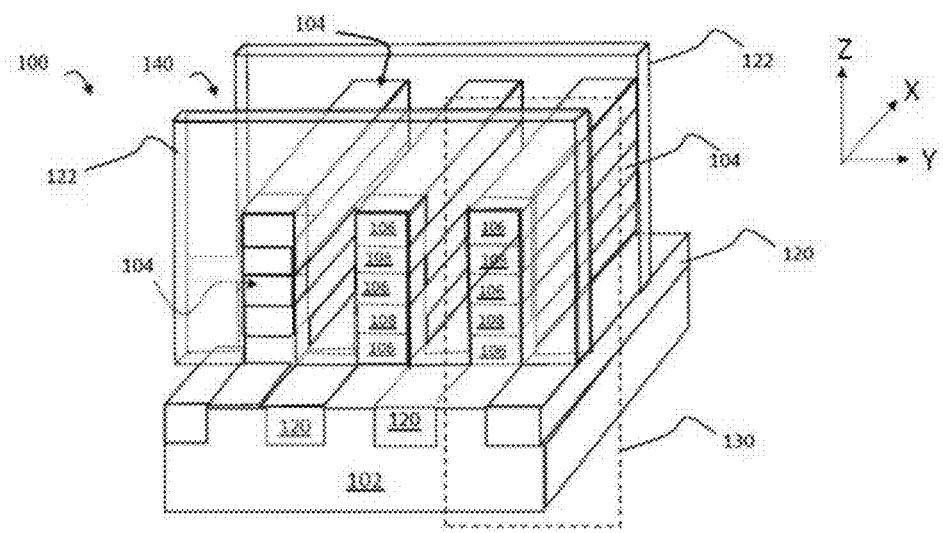
FIG. 1E depicts an end perspective view of a device including the device structure generally depicted in FIG. 1A.

Before the present disclosure is described in greater detail, it is to be understood that this disclosure is not limited to particular embodiments described, and as such may, of course, vary. It is also to be understood that the terminology used herein is for the purpose of describing particular embodiments only, and is not intended to be limiting. The skilled artisan will recognize many variants and adaptations of the embodiments described herein. These variants and adaptations are intended to be included in the teachings of this disclosure and to be encompassed by the claims herein.

It is to be understood that the various layers and/or regions shown in the accompanying drawings are not drawn to scale, and that one or more layers and/or regions of a type commonly used in FinFET devices may not be explicitly shown in a given drawing. This does not imply that the layers and/or regions not explicitly shown are omitted from the actual FinFET devices. Moreover, the same or similar reference numbers used throughout the drawings are used to denote the same or similar features, elements, or structures, and thus, a detailed explanation of the same or similar features, elements, or structures will not be repeated for each of the drawings.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present disclosure is not entitled to antedate such publication by virtue of prior disclosure. Further, the dates of publication provided could be different from the actual publication dates that may need to be independently confirmed.

Although any methods and materials similar or equivalent to those described herein can also be used in the practice or testing of the present disclosure, the preferred methods and materials are now described. Functions or constructions well-known in the art may not be described in detail for brevity and/or clarity. Embodiments of the present disclosure will employ, unless otherwise indicated, techniques of nanotechnology, organic chemistry, material science and engineering and the like, which are within the skill of the art. Such techniques are explained fully in the literature.

It should be noted that ratios, concentrations, amounts, and other numerical data can be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a numerical range of "about 0.1% to about 5%" should be interpreted to include not only the explicitly recited values of about 0.1% to about 5%, but also include individual values (e.g., 1%, 2%, 3%, and 4%) and the sub-ranges (e.g., 0.5%, 1.1%, 2.2%, 3.3%, and 4.4%) within the indicated range. Where the stated range includes one or both of the limits, ranges excluding either or both of those included limits are also included in the disclosure, e.g. the phrase "x to y" includes the range from 'x' to 'y' as well as the range greater than 'x' and less than 'y'. The range can also be expressed as an upper limit, e.g. 'about x, y, z, or less' and should be interpreted to include the specific ranges of 'about x', 'about y', and 'about z' as well as the ranges of 'less than x', less than y', and 'less than z'. Likewise, the phrase 'about x, y, z, or greater' should be interpreted to include the specific ranges of 'about x', 'about y', and 'about z' as well as the ranges of 'greater than x', greater than y', and 'greater than z'. In some embodiments, the term "about" can include traditional rounding according to significant figures of the numerical value. In addition, the phrase "about 'x' to 'y'", where 'x' and 'y' are numerical values, includes "about 'x' to about 'y'".

Unless defined otherwise, all technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the specification and relevant art and should not be interpreted in an idealized or overly formal sense unless expressly defined herein.

The articles "a" and "an," as used herein, mean one or more when applied to any feature in embodiments of the present invention described in the specification and claims. The use of "a" and "an" does not limit the meaning to a single feature unless such a limit is specifically stated. The article "the" preceding singular or plural nouns or noun phrases denotes a particular specified feature or particular specified features and may have a singular or plural connotation depending upon the context in which it is used.

The embodiments described herein provide methods of processing and device structures including three dimensional devices. Examples of three dimensional devices fabricated according to the present embodiments include HGAA devices, fin-type 3D transistor devices, and other devices. The embodiments are not limited in this context. Examples of semiconductor materials forming fin structures or similar structures of a 3D device include silicon and silicon:germanium alloys. A characteristic of FinFET devices or HGAA devices involves forming a given gate structure on various different sides of a semiconductor channel, where the semiconductor channel may be formed within a fin structure. Thus, the gate structure may act to gate the channel from various sides, as opposed to a planar MOSFET, where electrical gating takes place from just a top side of a transistor channel. In the case of HGAA devices, a gate may envelop the transistor channel on all sides, providing superior control as opposed to planar FET devices.

Various embodiments facilitate improved techniques for forming HGAA devices, improved HGAA devices, as well as device structures.

FIGS. 1A-1D illustrate an end view of a device structure during different stages of fabrication according to embodiments of the disclosure. FIG. 1E depicts an end perspective view of a device including the device structure generally depicted in FIG. 1A. Turning now to FIG. 1A, the device structure 100 may represent a portion of an HGAA device to be formed on a substrate. An HGAA device may include at least one transistor formed on a substrate. In the illustration in FIG. 1A and FIG. 1E there are shown one and three fins, respectively, disposed upon a substrate 102. In particular, in FIG. 1A, a single fin is represented by the fin structure 104, where the fin structure 104 extends above a plane P of the substrate, as shown. The fin structure 104 may have a fin axis that extends parallel to the plane P (X-Y plane) and along the X-axis of the Cartesian coordinate system shown. As detailed below, the fin structure 104 may serve as a precursor to an HGAA device to be formed.

As further shown in FIG. 1A the fin structure 104 includes a plurality of different layers. In accordance with various embodiments a fin structure 104 may include at least one silicon layer and at least two silicon:germanium alloy (SiGe) layers, wherein the at least one silicon layer and the at least two SiGe layers define the overall shape of the fin including the sidewalls of the fin structure. In the particular illustration of FIG. 1A, there are shown a series of four SiGe layers, represented as layers 106, and a series of four silicon layers, represented by layers 108. The layers 108 are arranged in a super-lattice to alternate with the layers 106. In various embodiments, the layers 106 have a germanium concentration of 30% or less. At the stage of processing illustrated in FIG. 1A the device structure 100 may resemble a conventional device structure for forming an HGAA device.

At FIG. 1B there is shown a subsequent stage of processing the device structure 100 of FIG. 1A. In accordance with embodiments of the disclosure the device structure 100 of FIG. 1A may be subject to high temperature annealing in an oxygen ambient. In some embodiments, the fin structure 104 may be annealed in an oxygen ambient such as pure $O_2$ at atmospheric pressure. The embodiments are not limited in this context. In some embodiments, annealing a fin structure may take place at a temperature between 800° C. and 1000° C. for a duration of five minutes to sixty minutes. The embodiments are not limited in this context. In some aspects, the temperature can be about 800° C. to 850° C., 850° C. to 900° C., 900° C. to 950° C., or 950° C. to 1000° C. for a period of time from about 5-15 minutes, 15-30 minutes, 30-45 minutes, or 4560 minutes.

In accordance with the present embodiments, annealing in an oxygen ambient of a fin-type super-lattice structure as shown in FIG. 1A produces a fin structure having encapsulated nanowires, as shown in FIG. 1B. As particularly illustrated in FIG. 1B, where an exemplary encapsulated nanowire structure is shown, the fin structure 104 internally has a very different structure as compared to the structure of FIG. 1A. In particular, the fin structure 104 includes an oxide layer 114 disposed on the outside of the fin structure 104. In various embodiments, after the performing of the oxygen annealing, the fin structure 104 may include at least one nanowire having a long axis extending along the fin axis (X-axis). The nanowire may comprise monocrystalline silicon. In the example of FIG. 1B the former structure of FIG. 1A, where silicon and SiGe are arranged in discreet layers, is altered to a structure where a series of silicon nanowires 112 are formed. The fin structure 104 now includes a matrix material 110 surrounding the silicon nanowires 112. In this embodiment, the matrix material 110 comprises monocrystalline SiGe.

In various embodiments, the silicon nanowires 112 and SiGe material of the matrix material 110 may include a unitary monocrystalline structure, as discussed further below. Additionally, the matrix material 110 may have a composition having a substantially higher germanium concentration than in the layers 106. For example, the SiGe material of the matrix material 110 may have a germanium concentration greater than 30% and in some cases greater than 50%, all concentrations expressed as molar percent. For example, in some embodiments the SiGe matrix material has a germanium concentration after annealing of about 30% to 75%, 35% to 70%, 40% to 70%, 45% to 70%, or 50% to 70%.

By way of explanation and without limitation as to a particular theory, the structure shown in FIG. 1B may result in the following manner. Given an appropriate temperature and duration of exposure to oxygen-containing ambient, a super-lattice fin structure such as the fin structure 104 of FIG. 1A may be oxidized. Oxidation may proceed from the outer surface of the fin structure 104, such as the sidewalls 124, as well as top. In particular, silicon within the layers 108 and layers 106 may oxidize to form $SiO_2$. The $SiO_2$ may thus form on the outer surface of the fin structure 104. Germanium material within the SiGe layers, layers 106, may not react with oxygen because a low free energy state of an assemblage of Si—Ge—O involves formation of two phases, $SiO_2$ and Ge. Accordingly, the oxide layer 114 may form as a layer of $SiO_2$ without substantial germanium content. A region of higher Ge concentration may form ahead of the front or inner surface of the $SiO_2$ region, represented by oxide layer 114. Under conditions where a rate of oxidation is greater than the rate of Ge diffusion into the core region of a SiGe layer (layer 106), Ge at the $SiO_2$ front may diffuse across an interface into a silicon layer. Because this process may take place just at a front edge (inner surface) of a $SiO_2$ region (oxide layer 114), diffusing Ge species may form a SiGe region within a silicon layer (layer 108) in a region toward the sidewalls 124. This results in formation of a SiGe region within a formerly pure silicon layer. As shown in FIG. 1B, a subsequent encapsulated nanostructure may result where a matrix of SiGe surround a silicon nanowire 112 on upper surface, lower surface, as well as sides.

In some aspects, the nanostructure exhibited by device structure 100 in FIG. 1B can be generated within a process window of annealing in an oxygen ambient. If annealing is excessive, such as use of annealing temperature above 1000° C. for a certain duration, a silicon nanowire structure may not be formed. Similarly the silicon nanowire structure may not form at annealing temperatures below 800° C. Of course upper and lower temperature bounds for formation of the encapsulated silicon nanowire structure may be dependent upon the duration of annealing, annealing ambient, as well as width (along Y axis) of a fin, thickness of layers 106 and layers 108, among other factors.

Accordingly, various embodiments provide an encapsulated nanostructure as shown in the fin structure 104 of FIG. 1B or FIG. 1C. In some embodiments, the nanostructure includes at least one nanowire having a cross section where a first dimension along the Z-axis and second dimension along the Y-axis are less than 50 nm, e.g. about 45 nm, 40 nm, 35 nm, 30 nm, or less. The encapsulated nanowire may be encapsulated in a fin structure as shown where the outer surface is composed of SiGe material and the silicon nanowire(s) does not extend on the outer surface of the fin structure.

In particular embodiments, the cross-sectional dimensions of a silicon nanowire may be less than 10 nanometers, and in some embodiments may be less than five nanometers. The final cross-sectional shape of a silicon nanowire may be controlled by choice of initial thickness of a silicon layer, as well as width of a fin structure, among other features. Additionally, the final dimensions of a silicon nanowire may be adjusted and accurately controlled by adjusting the duration of an annealing procedure, for example.

The formation of a nanostructure having encapsulated nanowires as shown in FIG. 1B may facilitate fabrication of superior HGAA devices. For example, as shown in FIG. 1C, the oxide layer 114 may be subsequently removed by known etching processes to remove a silicon oxide layer, producing a fin structure 116 having an encapsulated nanostructure composed of the silicon nanowires 112 surrounded by the matrix material 110. Because the matrix material 110 is composed of SiGe, in some embodiments, the SiGe matrix, that is, matrix material 110, may subsequently be removed by etching the matrix material 110 in an etchant that selectively etches SiGe with respect to silicon.

For example, turning to FIG. 1E for reference, there is shown a perspective view of the device structure 100 before formation of silicon nanowires according to the operations of FIGS. 1B and 1C. The device structure 100 includes trench isolation regions 120 as well as sidewall regions 122. Once the device structure 100 is annealed to form a nanostructure in the fin structures 104 as shown in FIG. 1B, the oxide layer 114 may be removed, followed by selective etching of SiGe material in the fin structures 104. Portions of fin structures 104 between the sidewall regions 122 may be exposed to the selective etchant, removing the matrix material 110. A resulting structure is shown in FIG. 1D. As shown in FIG. 1D, the silicon nanowires 112 now form an array of free standing silicon nanowires in channel regions of a device to be formed. In regions of the fin structures 104 outside of the sidewall regions 122, the fin structures 104 may be joined to other features in source/drain regions (not shown) of the device structure 100. Accordingly, the free standing silicon nanowires, silicon nanowires 112, may extend between source/drain regions of an HGAA device, similar to the structure of known HGAA devices before gate formation. Subsequently, a gate may be formed according to known processes around the silicon nanowires 112 in the region between the sidewall regions 122.

Figure 2C:
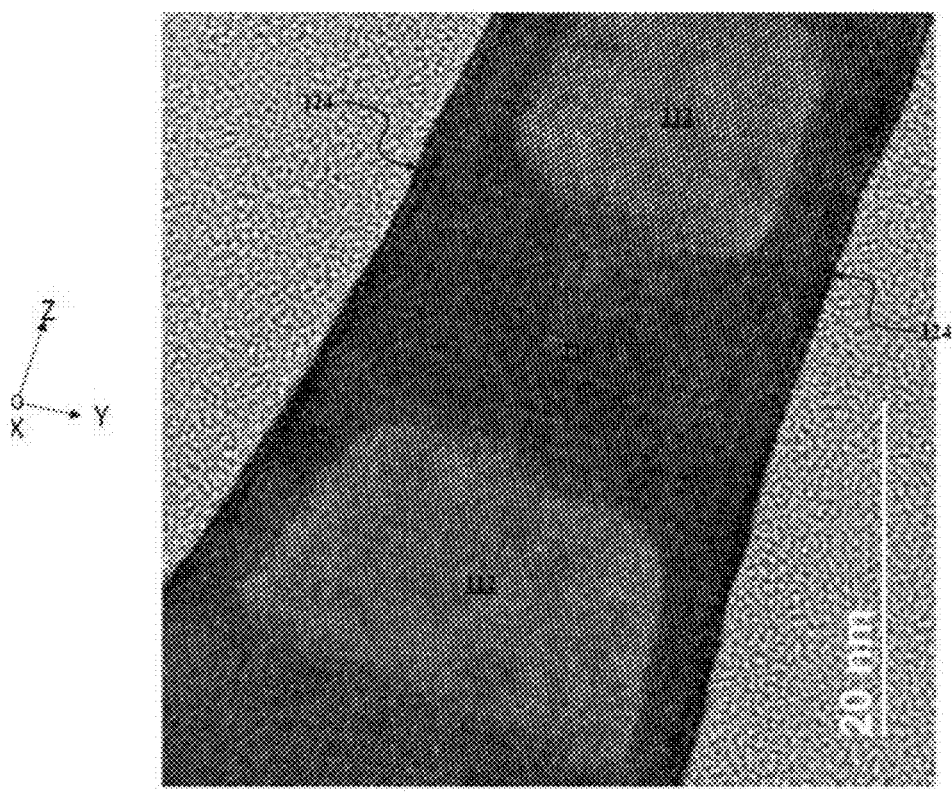
FIG. 2C depicts a close-up electron micrograph view of a portion of the device structure of FIG. 2B.

In some examples, a fin width of a fin structure used to form a nanowire may be 60 nm or less. Because the cross-sectional size and shape of silicon nanowires may be accurately controlled according to the processes for formation of the nanostructure of FIG. 1B, the resulting nanowires of an HGAA device may be more accurately and reproducibly formed compared with conventional HGAA devices. This may be especially useful for forming nanowires having cross-sectional dimensions less than 30 nm, or less than 10 nm, for example. FIG. 2A is an electron micrograph of an end view of an embodiment of a fin structure 104 during a first stage of processing. FIG. 2B is an electron micrograph of an end view of the fin structure of FIG. 2A at a subsequent stage of processing subsequent to the stage of FIG. 1A, in accordance with an embodiment of the disclosure. Additionally, FIG. 2C depicts a close-up electron micrograph view of a portion of the device structure of FIG. 2B. In this example, the fin structure 104 has an initial width along the Y-axis of approximately 50 nm and an initial height along the Z-direction of approximately 120 nm. The fin structure 104 includes eight layers, shown as layers 106 and layers 108, arranged in alternating fashion. The layers 106 in this example constitute SiGe layers, while the layers 108 constitute Si, as discussed above. The layers 106 and layers 108 have an initial thickness along the Z-axis of approximately 15 nm. After annealing at high temperature in an oxygen ambient the resultant structure is shown in FIG. 2B. As shown the fin structure 104 now includes an oxide layer 114 that surrounds a matrix material 110, composed of SiGe. The matrix material 110, in turn, encapsulates an array of silicon nanowires 112. The width of the semiconductor portion of the fin structure 104 is approximately 20 nm to 35 nm. Instead of constituting continuous layers that extend across the width of the fin structure 104, as in FIG. 2A, the layers 108 are transformed into encapsulated wires, the silicon nanowires 112.

Turning to FIG. 2C, there is shown a portion of the fin structure 104 of FIG. 2B including the silicon nanowires 112 and matrix material 110. In this portion, the width of the semiconductor portion of the fin structure 104 is approximately 25 nm to 30 nm. The width of the two silicon nanowires shown is approximately 15 nm and 22 nm, respectively. Each silicon nanowire 112 is bordered on a periphery region adjacent the sidewalls 124 by a 3 nm wide to 4 nm wide region of the matrix material 110. Accordingly, the matrix material 110 encapsulates the silicon nanowires 112. In addition, the electron micrograph of FIG. 2C illustrates that the atomic planes of the silicon nanowires 112 are in registry with the matrix material 110, composed of SiGe. Thus, the silicon nanowires 112 and SiGe material of matrix material 110 form a unitary monocrystalline structure. Moreover, the structure of FIG. 2C appears defect-free, meaning crystalline defects are not visible within the structure of FIG. 2C.

As a consequence of the processing shown in FIG. 1B and FIG. 2B, for example, the germanium composition of the matrix material 110 may be enhanced with respect to the germanium concentration of the layers 106. Since Ge may be excluded from the oxide layer 114, the average Ge concentration within the matrix material 110 may be increased in proportion to the amount of oxidation of the fin structure 104. For example, in some examples the initial Ge concentration in a SiGe layer of the fin structure 104 of FIG. 1A may be 30% or less. This allows the super-lattice structure of layers 106 and layers 108 to be formed without generating crystalline defects arising from too large a lattice mismatch between silicon layers and SiGe layers. This upper limit of Ge concentration in SiGe layers for formation of an epitaxial Si layer thereon, is approximately 30%. Above this Ge concentration, the aforementioned crystalline defects may be generated to accommodate the stress developed from lattice mismatch between a Si layer and SiGe layer. After formation of the encapsulated nanostructure of FIG. 1B, the concentration of Ge in the matrix material 110 may rise to greater than 50% even in circumstances where the concentration of Ge in the initial state of layer 106 is 30% or below. In some embodiments, the concentration of Ge in the matrix material 110 may approach 70% or more without engendering defects within the silicon nanowires 112. It is estimated that the Ge concentration in the structures shown in FIG. 2B and FIG. 2C is approximately 70%.

A further useful result of the techniques of the present embodiments is the rounded shape of the silicon nanowires, as shown in FIG. 2C, for example.

The present embodiments thus afford the ability to generate device structures, including an encapsulated nanostructure having a unitary monocrystalline structure where a SiGe matrix surrounds a Si nanowire. This device structure may create useful properties in such encapsulated silicon nanowires. For example, such nanowires may constitute strained silicon nanowires, where the silicon nanowires exist in a state of elastic strain. The degree of elastic strain imparted into such an encapsulated nanostructure may be greater than in known devices, due to the large lattice mismatch between the SiGe matrix and silicon nanowire, where Ge concentration may exceed 50% in the SiGe matrix. The greater elastic strain may be tailored to impart a higher carrier mobility in the silicon nanowires, for example.

In accordance with other embodiments, an encapsulated nanostructure may be formed having an overall shape different from a fin shape of the aforementioned embodiments. For example, in one embodiment a cubic shaped structure composed of a super-lattice of alternating silicon layers and SiGe layers may be subject to the annealing procedures as disclosed hereinabove. After annealing, the resulting structure may include an outer oxide layer surrounding a SiGe matrix, where the SiGe matrix in turn, encapsulates at least one silicon region. This may result in formation of a silicon nanoisland assembly where the silicon region constitutes a silicon nanoisland.

In an example where eight layers, four Si and four SiGe layers, are arranged in a cube-shaped super-lattice, the resultant structure after annealing may include a SiGe matrix encapsulating four spherical or equiaxed silicon islands in an interior region, where the silicon islands are elastically strained.

In other embodiments, an encapsulated nanostructure may be formed by preparing a super-lattice composed of two different layer types where a component of a first layer type preferentially oxides with respect to a component of the second layer type. In this manner, after subject to an oxidation anneal, material of the second layer type may form an encapsulating region surrounding material from the first layer type in a manner analogous to the Si/SiGe system disclosed herein.

FIG. 3 depicts an exemplary process flow 300 according to other embodiments of the disclosure. At block 302 the operation is performed of providing a fin structure extending above a substrate plane of a substrate, wherein the fin structure comprises at least three layers. The fin structure may comprise at least one silicon layer and at least two SiGe layers, wherein the at least one silicon layer and the at least two SiGe layers define sidewalls of the fin structure. In some embodiments, the fin structure may comprise at least three SiGe layers and at least two silico layers.

At block 304 the operation is performed of annealing the fin structure in an oxygen ambient, wherein a silicon nanowire assembly is formed The silicon nanowire assembly may include a silicon nanowire formed from the at least one silicon layer, and a SiGe matrix surrounding the silicon nanowire, and a silicon oxide layer disposed on the SiGe matrix.

At block 306, the operation is performed of removing the oxide layer. At block 308, the operation is performed of selectively removing the SiGe matrix, wherein at least one free standing silicon nanowire having an exposed outer surface is formed.

Figure 4:
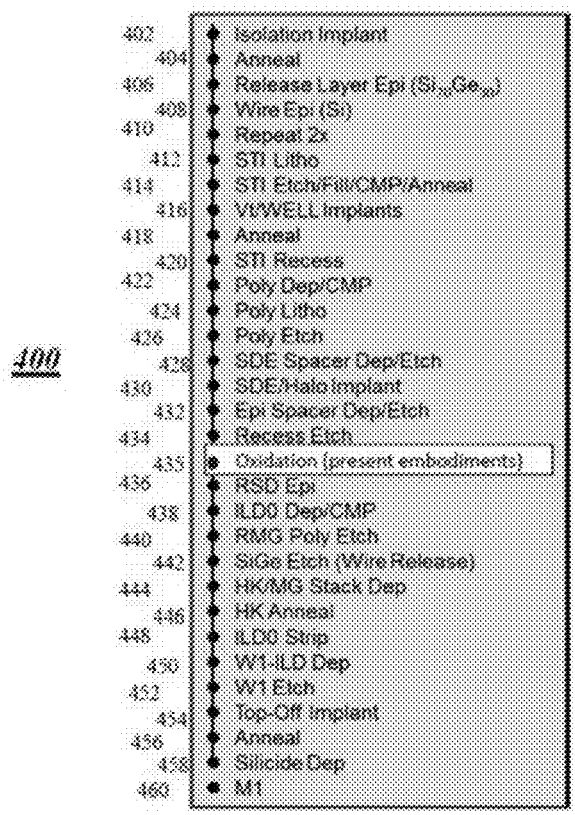
FIG. 4 presents another exemplary process flow according to embodiments of the disclosure.

FIG. 4 depicts another process flow 400 according to other embodiments of the disclosure. The process flow 400 includes multiple operations, shown as block 402 to block 460, where the functions of each operation are illustrated in FIG. 4. The process flow 400 may include operations consistent with known processing to form an HGAA structure. The operations shown may generally be performed in the sequence listed. At block 402 an isolation ion implantation may be performed, at block 404 annealing may be performed after the isolation implant. At block 406 an epitaxial layer of Si.$_7$Ge.$_3$ may be grown. At block 408 an epitaxial layer of silicon may be grown on the Si.$_7$Ge.$_3$ layer. At block 410, blocks 406 and 408 may be repeated, for example, two times. At block 412, trench isolation lithography may be performed followed by trench etch, fill, chemical mechanical polishing (CMP) and annealing at block 414. At block 416 implantation for threshold voltage adjustment/well formation may be performed. At block 418 an anneal may be performed, followed by a shallow trench isolation recess operation at block 420. At block 422 a polysilicon deposition operation and CMP are performed. At block 424 a lithography step may be performed followed by an etch step at 426 to define a polysilicon structure. At block 428 a source/drain extension spacer deposition and etch operation are performed to define a spacer. At block 430 a source/drain extension/Halo implant operation may be performed. At block 432 an EPI spacer deposition and etch process may be performed. At block 434 a recess etch may be performed. At block 435 a high temperature oxidation process according to the aforementioned embodiments may be performed. At block 436 a raised/source drain (RSD) epitaxial deposition may be performed. At block 438 an interlevel dielectric deposition and CMP process may be performed. At block 440 a replacement metal gate poly etch process may be performed. At block 442 a selective etch may be performed to selectively remove Si.$_7$Ge.$_3$ layers in a gate region, forming free standing silicon nanowires. At block 444 a high dielectric constant gate insulator may be deposited around the silicon nanowires. A gate material such as metal gate may be deposited around the gate insulator. At block 446 annealing the gate stack is performed. At block 448 a strip of the interlevel dielectric may be performed. At block 450 a W1-interlevel dielectric may be deposited followed by etch of the W1 at block 452. At block 454 a top-off implantation process is performed. At block 456 a further anneal subsequent to the top-off implant is performed. At block 458 deposition silicide material to form contacts may be performed. At block 460 a metal layer M1 is deposited. In particular, the operation 435 may constitute a high temperature oxidation operation as disclosed hereinabove. The operation 435 may be performed before selective etching of a SiGe layer to form free standing silicon wires (operation 442).

Advantages provided by the present embodiments include the ability to form superior silicon nanowires in an HGAA device, and to better control processing of such nanowires. Additionally, encapsulated nanostructures may be formed that include strained silicon nanowires within a SiGe matrix.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

It should be emphasized that the above-described embodiments of the present disclosure are merely possible examples of implementations, and are set forth only for a clear understanding of the principles of the disclosure. Many variations and modifications may be made to the above-described embodiments of the disclosure without departing substantially from the spirit and principles of the disclosure. All such modifications and variations are intended to be included herein within the scope of this disclosure.

We claim:

1. A method of forming a nanowire, the method comprising:
   providing a fin structure extending above a substrate plane of a substrate, wherein the fin structure comprises at least three layers, wherein the fin structure comprises at least one silicon layer and at least two silicon:germanium alloy (SiGe) layers, wherein the at least one silicon layer and the at least two SiGe layers define sidewalls of the fin structure; and
   annealing the fin structure in an oxygen ambient, wherein a silicon nanowire assembly is formed, wherein the silicon nanowire assembly comprises:
   a silicon nanowire formed from the at least one silicon layer,
   a SiGe matrix surrounding the silicon nanowire; and
   a silicon oxide layer disposed on the SiGe matrix.

2. The method of claim 1, wherein the annealing comprises annealing the fin structure in an oxygen ambient at a temperature between 800° C. and 1000° C.

3. The method of claim 1, wherein the annealing comprises annealing the fin structure for five minutes to sixty minutes.

4. The method of claim 1, wherein the fin structure comprises at least three SiGe layers and at least two silicon layers, and
   wherein the silicon nanowire assembly comprises at least two silicon nanowires.

5. The method of claim 1, wherein the at least one free standing silicon nanowire is defect-free.

6. The method of claim 1, wherein the fin structure comprises a fin axis extending parallel to a plane of the substrate,
   wherein the fin structure comprises a fin width of 60 nm or less, and
   wherein the silicon nanowire has a first dimension extending less than 50 nm along a first direction perpendicular to the fin axis, and a second dimension extending less than 50 nm along a second direction perpendicular to the first direction and the fin axis.

7. The method of claim 1, further comprising removing the silicon oxide layer and selectively removing the SiGe matrix, wherein at least one free standing silicon nanowire having an exposed outer surface is formed.

8. The method of claim 7, wherein the at least one free standing silicon nanowire is connected to a source/drain region formed on the substrate, the method further comprising forming a gate around the exposed outer surface, wherein the gate encapsulates the at least one free standing silicon nanowire.

9. The method of claim 1, wherein the at least two SiGe layers comprise a first germanium concentration of 30% or less, and
   wherein the SiGe matrix comprises a second germanium concentration of greater than 30%.

10. The method of claim 9, wherein the second germanium concentration is greater than 50%.

11. The method of claim 10, further comprising removing the silicon oxide layer and selectively removing the SiGe matrix, wherein at least one free standing silicon nanowire having an exposed outer surface is formed.

12. A nanostructure, comprising:
a substrate;
a fin structure disposed on the substrate, the fin structure having a fin axis, wherein the fin structure comprises:
at least one silicon nanowire having a long axis extending along the fin axis, the at least one silicon nanowire comprising monocrystalline silicon; and
a matrix material surrounding the nanowire, the matrix material comprising a monocrystalline silicon:germanium alloy (SiGe),
wherein the at least one silicon nanowire has a first dimension extending less than 50 nm along a first direction perpendicular to the fin axis, and a second dimension extending less than 50 nm along a second direction perpendicular to the first direction and the fin axis,
wherein the fin structure has an outer surface comprising SiGe material, and
wherein the at least one silicon nanowire does not extend on the outer surface of the fin structure.

13. The nanostructure of claim 12, wherein the at least one silicon nanowire is a strained silicon nanowire.

14. The nanostructure of claim 12, the at least one silicon nanowire comprising a plurality of silicon nanowires, wherein the matrix material surrounds the plurality of silicon nanowires.

15. The nanostructure of claim 12, wherein the fin axis extends parallel to a plane of the substrate,
wherein the at least one silicon nanowire has a first dimension extending less than 20 nm along a first direction perpendicular to the fin axis, and a second dimension extending less than 20 nm along a second direction perpendicular to the first direction and the fin axis.

16. The nanostructure of claim 12, wherein the at least one silicon nanowire is defect-free.

17. The nanostructure of claim 12, wherein the at least one silicon nanowire and silicon:germanium alloy (SiGe) comprise a unitary monocrystalline structure.

18. The nanostructure of claim 17, wherein the silicon:germanium alloy (SiGe) comprises a germanium concentration of greater than 50%.

19. A method of forming an encapsulated nanostructure, the method comprising:
forming a multilayer structure extending above a substrate plane of a substrate, wherein the multilayer structure comprises at least three layers, wherein the multilayer structure comprises at least one silicon layer and at least two silicon:germanium alloy (SiGe) layers, wherein the at least one silicon layer and the at least two SiGe layers define a plurality of sides of the multilayer structure; and
annealing the multilayer structure in an oxygen ambient, wherein a silicon nanoisland assembly is formed, wherein the silicon nanoisland assembly comprises:
an outer surface having a top surface and a plurality of sides,
a silicon nanoisland formed from the at least one silicon layer and disposed in an interior of the silicon nanoisland assembly;
a SiGe matrix surrounding the silicon nanoisland; and
a silicon oxide layer disposed on the SiGe matrix wherein the outer surface comprises silicon oxide.

20. The method of claim 19, wherein the at least two SiGe layers comprise a first germanium concentration, and wherein the SiGe matrix comprises a second Ge concentration greater than the first Ge concentration.

* * * * *